United States Patent [19]

Koning et al.

[11] Patent Number: 5,587,452
[45] Date of Patent: Dec. 24, 1996

[54] POLYAMIDE-IMIDE

[75] Inventors: Cornelis E. Koning, Schinnen, Netherlands; Lilian M. J. Teuwen, Maaseik, Belgium

[73] Assignee: DSM N.V., Netherlands

[21] Appl. No.: 498,278

[22] Filed: Jul. 3, 1995

[30] Foreign Application Priority Data

Jul. 11, 1994 [BE] Belgium ................ 09400643

[51] Int. Cl.$^6$ .................................................. C08G 73/14
[52] U.S. Cl. .................. 528/350; 528/170; 528/172; 528/173; 528/176; 528/183; 528/188; 528/229; 528/310; 528/322; 528/335; 528/352; 528/353; 428/395; 428/473.5; 425/542
[58] Field of Search ...................... 528/353, 352, 528/350, 310, 335, 170, 172, 173, 176, 183, 188, 229, 322; 425/542; 428/473.5, 474.5, 395

[56] References Cited

U.S. PATENT DOCUMENTS

| | | | |
|---|---|---|---|
| 3,549,601 | 12/1970 | Fowell | 528/335 |
| 4,066,631 | 1/1977 | Dimmig | 528/310 |

OTHER PUBLICATIONS

Chemical Abstracts, vol. 101, No. 8, 20 Aug. 1984; Columbus, Ohio, U.S., Abstract No. 55604j, Arkhipova et al., 'Polycondensation of Nonsubstituted Imides of Trimellitic Acid With Diamines and Properties of Polyamidoimides Based on Them'.

Arkhipova et al., 'Polycondensation of Nonsubstituted Imides of Trimellitic Acid with Diamines and The Properties of the Resultant Polyamidoimides', Polymer Science U.S.S.R., vol. 26, No. 3, pp. 634–644, Aug., 1984.

*Primary Examiner*—James J. Seidleck
*Assistant Examiner*—P. Hampton-Hightower
*Attorney, Agent, or Firm*—Cushman Darby Cushman IP Group of Pillsbury Madison & Sutro, LLP

[57] ABSTRACT

The invention relates to a polyamide-imide containing recurring units according to the formula $$\left[ \begin{array}{c} \text{structure} \end{array} \right]$$

where
Y is an arylene group, and
R and R' are alkylene groups, in which at least 50 mole % of R and/or R' is a butylene group.
The polyamide-imides are semi-crystalline.

They are suitable for injection moulding applications, structural moulded parts, films, coatings and fibres. They can preferably be used in fields of application where temperatures above 200° C. occur.

18 Claims, No Drawings

POLYAMIDE-IMIDE

FIELD OF THE INVENTION

The invention relates to a polyamide-imide containing recurring units according to the formula

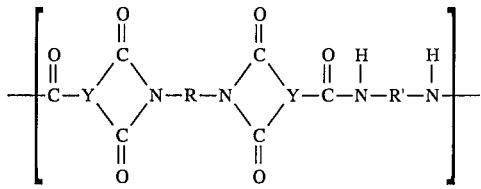

where
Y is an arylene group, and
R and R' are alkylene groups.

Amorphouse polyamide - imides and a method for their production are described in U.S. Pat. No. 4,066,631.

The polyamide-imides formed according to the examples of this patent publication are amorphous. Because of their amorphous nature, these polyamide-imides are used mainly in transparent films.

A drawback of the polyamide-imides formed according to U.S. Pat. No. 4,066,631 is that, owing to their amorphous nature, it is difficult to use them in injection moulding applications.

The aim of the invention is to obtain a polyamide-imide that can be used in injection moulding.

SUMMARY AND OBJECTS OF THE INVENTION

The invention is characterized in that at least 50 mole % of R and/or R' in the polyamide-imide according to the above-mentioned formula is a butylene group. This, surprisingly, results in a semi-crystalline polyamide-imide.

This makes the polyamide-imide according to the invention highly suitable for injection moulding applications, in which short cycle times are also possible.

Further advantages of the polyamide-imide according to the invention are its higher stiffness and its better solvent resistance.

DETAILED DESCRIPTION OF THE INVENTION

The present invention concerns a polyamide-imide containing recurring units represented by the formula:

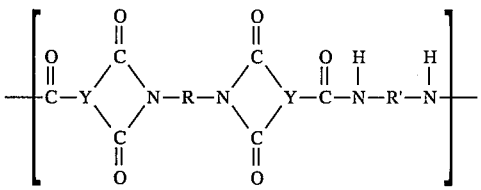

wherein the formula Y represents an arylene group, and R and R' are alkylene groups wherein at least 50 mole % of R and/or R' is a butylene group. R and R' can, if desired, both be butylene groups. The arylene groups represented by Y include a phenylene group. Injection molded and shaped products comprised of the present polyamide-imide are obtainable more facilely than amorphous polyamide-imides.

The polyamide-imide according to the invention is for example synthesized in three successive steps:

1. the condensation reaction of an aliphatic diamine and an aromatic tricarboxylic acid anhydride in a molar ratio of 1:2 to form an intermediate diimide-diacid,
2. conversion of the intermediate diimide-diacid into an intermediate diimide diacid chloride by a reaction with for example thionyl chloride ($SOCl_2$),
3. reaction of the intermediate diimide diacid chloride with an aliphatic diamine to form the desired polyamide-imide. If desired a small amount of for example benzoyl chloride can be added as chain terminating agent or to block the polymers.

The above synthesis method is also described in U.S. Pat. No. 4,066,631.

Another synthesis method is the synthesis of a polyamide-imide via the formation of a so-called nylon salt.

To this end first the condensation reaction of an aliphatic diamine and an aromatic tricarboxylic acid anhydride in a molar ratio of 1:2 is carried out, which yields an intermediate diimide-diacid. Subsequently an aliphatic diamine is added to a solution of this intermediate diacid in N-methylpyrrolidone (NMP) and the salt precipitates. This salt can be polymerized to form a prepolymer in a high-boiling solvent, for example cyclohexyl pyrrolidone, at 240°–260° C. A polyamide-imide of the desired molar weight is obtained in customary manner by variation of the after-condensation time and the temperature.

As aliphatic diamine use is made of the diamines and mixtures of diamines according to the formula

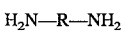

or

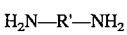

where R and R' are alkylene groups with 2 to 9 carbon atoms. Examples of alkylene groups with 2–9 carbon atoms are ethylene, butylene, pentylene, hexylene and nonylene.

In the polyamide-imides according to the invention at least 50 mole % of R and/or R' is a linear butylene group.

Preferably, R and/or R' is a butylene group.

With special preference both R and R' are butylene groups.

With special preference, therefore, both in step 1 and in step 3 of the first-mentioned synthesis method a 1,4-diaminobutane is added as aliphatic diamine.

As aromatic tricarboxylic acid anhydride use is made of aromatic compounds according to the formula

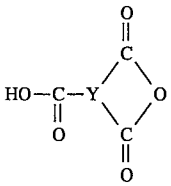

where Y is an arylene group, and with at least two carboxyl groups substituted in the ortho position, so that an anhydride can be formed.

The aromatic tricarboxylic acid anhydride contains 9–20 carbon atoms.

The arylene group Y is optionally substituted and is for example a phenylene, tolylene, xylylene, naphthylene or biphenylene group.

Preferably, Y is a phenylene group. The aromatic tricarboxylic acid anhydride preferably used is trimellitic acid anhydride.

The polyamide-imide according to the invention may further contain the customary additives, such as fibres, fillers, nucleating agents, plasticizers, flame retardants, stabilizers and impact modifiers.

Thanks to the strongly improved properties the polyamide-imide according to the invention is suitable for a very wide range of applications, such as injection moulding applications, structural moulded articles, films, coatings and fibres. They are preferably applied in fields of application where temperatures above 200° C. occur, for example in connectors for electric and electronic applications that are soldered at temperatures above 260° C., in insulating films in electronics that must be capable to withstand high temperatures, in separation membranes for hot gases, in flexible printed circuit boards, in fibres for heat-insulating clothing and in injection moulding applications for the engine space of cars.

The invention will be elucidated on the basis of the examples, without being limited thereto.

EXAMPLES

The melting point ($T_m$) and the glass transition temperature ($T_g$) of the synthesized polyamide-imides were determined by means of Differential Scanning Calorimetry (DSC). The heating up and cooling down rates were 20° C. per minute. Measurements were performed on the polymer powder. The melting point was determined in the first and the second heating curve ($T_{m,1}$ and $T_{m,2}$); the glass transition temperature was determined in the second heating curve ($T_{g,2}$). In addition, the melting heat was determined during both the first and the second heating curve ($\Delta H_{m,1}$ and $\Delta H_{m,2}$).

The flexural modulus was determined according to ASTM D790.

EXAMPLE I

The Synthesis of polyamide-imide (PAI 4,4)

1. The synthesis of tetramethylene-bis-(N-trimellitimide)

333 g (1.7 moles) of trimellitic acid anhydride in 950 ml of n-methyl-2-pyrrolidone (NMP) was introduced into a 2-liter flask provided with a thermometer, a stirrer, a reflux cooler and a nitrogen inlet. A solution of 75 g (0.85 mole) of 1,4-diaminobutane in 300 ml of NMP was added dropwise and with stirring at room temperature. The stirred reaction mixture was heated to 70° C. in five hours. About 50 ml xylene was added to the clear solution. The solution was heated to reflux temperature (155° C.), the water being removed azeotropically using a Dean-Stark trap. Upon cooling a white crystalline product precipitated. This product was isolated by means of filtration, washed with methanol and dried under vacuum at 80° C. 361 g of the tetramethylene-bis-(N-trimellitimide) was obtained.

2. The synthesis of the diacid chloride derivative of tetramethylene-bis-(N-trimellitimide)

175 g (0.4 mole) of tetramethylene-bis-(N-trimellitimide) was mixed with thionyl chloride ($SOCl_2$) in a 1-liter flask provided with a nitrogen gas inlet, a thermometer, a stirrer and a reflux cooler, which at the top was provided with a gas absorption device (40 g of NaOH in 200 ml of water). 2 ml of N,N-dimethylformamide (DMF) was used as catalyst. The mixture was stirred at reflux temperature (80° C.) for 22 hours. After this, the excess $SOCl_2$ was distilled off, following which hexane was added and another distillation was carried out to remove any traces of $SOCl_2$. The white product obtained was washed with n-hexane and dried at 80° C. under nitrogen. 185.5 g of the diacid chloride was obtained.

3. The synthesis of polyamide-imide of 1,4-diaminobutane and the diacid chloride derivative of tetramethylene-bis-(N-trimellitimide) (polyamide-imide (4,4) or PAI 4,4)

0.16 g (0.18 mole) of diaminobutane (DAB) dissolved in NMP/2% LiCl was charged, together with 36.5 g (0.36 mole) of triethylamine, to a 2-liter flask provided with a stirrer, a thermometer, a drop funnel and a nitrogen gas inlet. The solution was cooled to −15° C. in a solid $CO_2$/acetone bath. 85 g (0.18 mole) of the diacid chloride in NMP/2% LiCl was added dropwise. As chain terminating agent 0.25 g of benzoyl chloride (0.002 mole) was added. In total, 1500 ml of NMP was used as solvent. The reaction mixture was stirred vigorously for 30 minutes while the temperature was kept at −15° C. After this, the temperature was raised to room temperature in a period of 2 hours. Subsequently the reaction mixture was stirred for 4 hours at 60° C. The polymer solution was poured out into methanol. The white polymer precipitate was washed thoroughly with methanol, filtered off and dried under vacuum for 48 hours at 120° C. 84 g of polymer was obtained.

EXAMPLE II

The Synthesis of polyamide-imide (PAI 6,4)

1. and 2. The synthesis of the diacid chloride derivative of tetramethylene-bis-(N-trimellitimide) was carried out as described in Example I.

3. The synthesis of the polyamide-imide of 1,6-diaminohexane and the diacid chloride derivative of tetramethylene-bis-(n-trimellitimide) (polyamide-imide (6,4)) was carried out as in step 3 of Example I.

COMPARATIVE EXPERIMENTS A–C

The Syntheses of polyamide-imide (PAI 3,3), (PAI 6,6) and (PAI 9,9)

The Syntheses of polyamide-imide PAI (3,3), PAI (6,6) and PAI (9,9) were carried out as described in Example I. As diamine, in step 1 and step 3 use was made of, respectively, 1,3-diaminopropane, 1,6-diaminohexane and 1,9-diaminononane.

To cause the tri- and nonamethylene-bis-(N-trimellitimide) formed to precipitate from the reaction mixture, distilled water was added in step 1 of the reaction.

TABLE 1

|   | PAI | $T_{m,1}$ (°C.) | $\Delta H_{m,1}$ (J/g) | $T_{g,2}$ (°C.) | $T_{m,2}$ (°C.) | $\Delta H_{m,2}$ (J/g) |
| --- | --- | --- | --- | --- | --- | --- |
| I | 4.4 | 346 | 53 | 158 | 344 | 58 |
| II | 6.4 | 289 | 53 | 140 | 285 | 27 |
| A | 3.3 | 249 | 7 | 169 | — | — |
| B | 6.6 | 257 | 42 | 119 | — | — |
| C | 9.9 | 170 | 44 | 87 | — | — |

It is evident that the polyamide-imides according to experiments A–C do not have a melting point during the second heating curve, and therefore they do not have any crystallinity, either.

EXAMPLES III–V

The Synthesis of copolyamide-imide of tetramethylene-bis-(N-trimellitimide) with Mixtures of 1,4-diaminobutane and 1,6-diaminohexane 1. and 2. The synthesis of the diacid chloride derivative of tetramethylene-bis-(N-trimellitimide) was carried out as described in Example I.

3. The synthesis of the copolyamide-imide of mixtures of 1,4-diaminobutane (DAB) and 1,6-diaminohexane (DAH) and the diacid chloride derivative of tetramethylene-bis-(N-trimellitimide).

The copolyamide-imide was obtained according to the synthesis method described in Example I; instead of 1,4-diaminobutane in step 3 an equimolar amount of a mixture of 1,4-diaminobutane and 1,6-diaminohexane was used.

TABLE 2

| | molar ratio DAB/DAH | $T_{m,1}$ (°C.) | $\Delta H_{m,1}$ (J/g) | $T_{g,2}$ (°C.) | $T_{m,2}$ (°C.) | $\Delta H_{m,2}$ (J/g) |
|---|---|---|---|---|---|---|
| III | 50/50 | 290 | 30 | 150 | 289 | 12 |
| IV | 75/25 | 317 | 50 | 154 | 314 | 35 |
| V | 80/20 | 321 | 44 | 153 | 310 | 35 |

EXAMPLE VI AND COMPARATIVE EXPERIMENT D

Both PAI (4,4) and PAI (6,6) were injection moulded to form bars. Subsequently the properties of the injection moulded polyamide-imides were determined.

TABLE 3

| | $T_{g,1}$ (°C.) | $T_{m,1}$ (°C.) | $\Delta H_{m,1}$ (J/g) | Flexural modulus (MPa) |
|---|---|---|---|---|
| VI | 146 | 329 | 39.5 | 4200 |
| D | 118 | — | — | 3190 |

Due to its crystallinity the modulus of Example VI, the PAI (4,4) is significantly higher.

EXAMPLE VII AND COMPARATIVE EXPERIMENT E

Example VII

An injection moulded bar of PAI (4,4) was conditioned at 35° C. and 90% RH (relative humidity) until maximum moisture absorption was achieved. It was then submerged for 10 seconds in soldering tin having a temperature of 260° C. The bar did not exhibit any blister formation and/or deformation.

Comparative Experiment E

An injection moulded bar of PAI (6,6) was conditioned at 35° C. and 90% RH (relative humidity) until maximum moisture absorption was achieved. It was then submerged for 10 seconds in soldering tin having a temperature of 260° C.

The bar exhibited deformation.

The amorphous PAI (6,6) is clearly not resistant to high temperatures, whereas the semi-crystalline PAI (4,4) does not undergo any changes at this high temperature.

We claim:

1. A semi-crystalline polyamide-imide containing recurring units represented by the formula

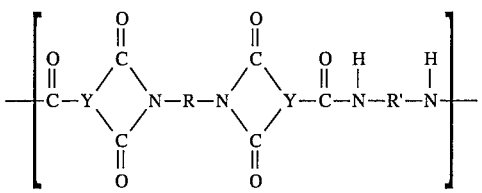

wherein said formula

Y represents an arylene group, and

R and R' are alkylene groups, and wherein at least 50 mole % of at least one of R or R' is a linear butylene group.

2. A semi-crystalline polyamide-imide according to claim 1, wherein R is a linear butylene group.

3. A semi-crystalline polyamide-imide according to claim 1 wherein R and R' are linear butylene groups.

4. A semi-crystalline polyamide-imide according to claim 1, wherein Y is a phenylene group.

5. A semi-crystalline polyamide-imide according to claim 1, wherein R' is a linear butylene group.

6. A semi-crystalline polyamide-imide according to claim 1, wherein R represents an linear alkylene group having 2 to 9 carbon atoms.

7. A semi-crystalline polyamide-imide according to claim 6, wherein said linear alkylene group is ethylene, butylene, pentylene, hexylene or nonylene.

8. Amended) A semi-crystalline polyamide-imide according to claim 1, wherein R' represents a linear alkylene group having from 2 to 9 carbon atoms.

9. A semi-crystalline polyamide-imide according to claim 8, wherein the linear alkylene group is ethylene, butylene, pentylene, hexylene or nonylene.

10. A semi-crystalline polyamide-imide according to claim 1, wherein Y is a phenylene, tolylene, xylylene, naphthalene or biphenylene group.

11. A semi-crystalline polyamide-imide according to claim 1, wherein R represents a linear alkylene group having 2 to 9 carbon atoms, R' represents a linear alkylene group having 2 to 9 carbon atoms, and Y represents a phenylene, tolylene, xylxylene, napthylene or biphenylene group provided that at least 50 mole % of at least one of R or R' is a linear butylene group.

12. A composition which comprises a semi-crystalline polyamide-imide according to claim 1 and at least one additive which is at least one member selected from the group consisting of fibers, fillers, nucleating agents, platicizers, flame retardants and stabilizers.

13. A shaped product containing a semi-crystalline polyamide-imide according to claim 1.

14. A film comprised of a semi-crystalline polyamide-imide according to claim 1.

15. A molded article obtained by molding a composition comprising a semi-crystalline polyamide-imide according to claim 1.

16. A fiber obtained from a composition comprising a semi-crystalline polyamide-imide according to claim 1.

17. A semi-crystalline polyamide-imide containing recurring units represented by the formula:

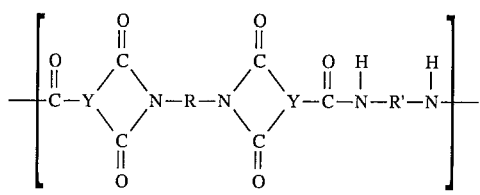

wherein said formula Y represents a phenylene, tolylene, xylylene, naphthalene or biphenylene group, and R and R' both represent linear butylene groups.

18. An injection molding process which comprises the step of injection molding a semi-crystalline polyamide-imide according to claim 1 at a temperature above about 289° C.

* * * * *